(12) United States Patent
Lee et al.

(10) Patent No.: US 9,063,849 B2
(45) Date of Patent: Jun. 23, 2015

(54) DIFFERENT TYPES OF MEMORY INTEGRATED IN ONE CHIP BY USING A NOVEL PROTOCOL

(75) Inventors: Peter Wung Lee, Saratoga, CA (US); Fu-Chang Hsu, San Jose, CA (US)

(73) Assignee: Aplus Flash Technology, Inc., Fremont, CA (US)

( * ) Notice: Subject to any disclaimer, the term of this patent is extended or adjusted under 35 U.S.C. 154(b) by 592 days.

(21) Appl. No.: 13/200,141

(22) Filed: Sep. 19, 2011

(65) Prior Publication Data

US 2012/0072647 A1   Mar. 22, 2012

Related U.S. Application Data

(60) Provisional application No. 61/403,556, filed on Sep. 17, 2010.

(51) Int. Cl.

| | |
|---|---|
| *G06F 12/00* | (2006.01) |
| *H05K 3/00* | (2006.01) |
| *G06F 12/06* | (2006.01) |
| *G06F 12/02* | (2006.01) |
| *G11C 5/06* | (2006.01) |
| *G11C 7/10* | (2006.01) |
| *G11C 11/00* | (2006.01) |
| *G11C 16/32* | (2006.01) |

(52) U.S. Cl.
CPC ....... *G06F 12/0638* (2013.01); *Y10T 29/49124* (2015.01); *G06F 12/0246* (2013.01); *G06F 2212/7208* (2013.01); *G11C 5/066* (2013.01); *G11C 7/10* (2013.01); *G11C 7/1006* (2013.01); *G11C 7/1039* (2013.01); *G11C 7/1045* (2013.01); *G11C 11/005* (2013.01); *G11C 16/32* (2013.01); *G11C 2216/30* (2013.01); *Y02B 60/1225* (2013.01)

(58) Field of Classification Search
None
See application file for complete search history.

(56) References Cited

U.S. PATENT DOCUMENTS

| | | | |
|---|---|---|---|
| 2008/0082766 A1 | 4/2008 | Okin et al. | |
| 2008/0140916 A1 * | 6/2008 | Oh et al. | 711/103 |
| 2008/0244197 A1 | 10/2008 | Furtek et al. | |
| 2008/0279003 A1 | 11/2008 | Kim et al. | |
| 2009/0049274 A1 | 2/2009 | Norman | |
| 2009/0161451 A1 | 6/2009 | Kim | |
| 2010/0174887 A1 | 7/2010 | Pawlowski | |
| 2011/0051519 A1 * | 3/2011 | Lee et al. | 365/185.18 |

(Continued)

OTHER PUBLICATIONS

PCT Search Report—Aplus Flash.

(Continued)

*Primary Examiner* — Denise Tran
(74) *Attorney, Agent, or Firm* — Saile Ackerman LLC; Stephen B. Ackerman

(57) ABSTRACT

A semiconductor chip contains four different memory types, EEPROM, NAND Flash, NOR Flash and SRAM, and a plurality of major serial/parallel interfaces such as I²C, SPI, SDI and SQI in one memory chip. The memory chip features write-while-write and read-while-write operations as well as read-while-transfer and write-while-transfer operations. The memory chip provides for eight pins of which two are for power and up to four pins have no connection for specific interfaces and uses a novel unified nonvolatile memory design that allow the integration together of the aforementioned memory types integrated together into the same semiconductor memory chip.

8 Claims, 6 Drawing Sheets

(56) References Cited

U.S. PATENT DOCUMENTS

2011/0258364 A1* 10/2011 Leung ........................... 711/103
2012/0134194 A1* 5/2012 Kim et al. ....................... 365/63

OTHER PUBLICATIONS

PCT/US 11/01609, Technology, Inc.
Mail date—Mar. 30, 2012.

* cited by examiner (A) : Bus not ready  (B) : Start data transfer  (C) : Memory Select (MS)
(D) : EMR Select & Suspend Function Period: Code=EM*
(E) : Data valid  (F) : Stop data transfer

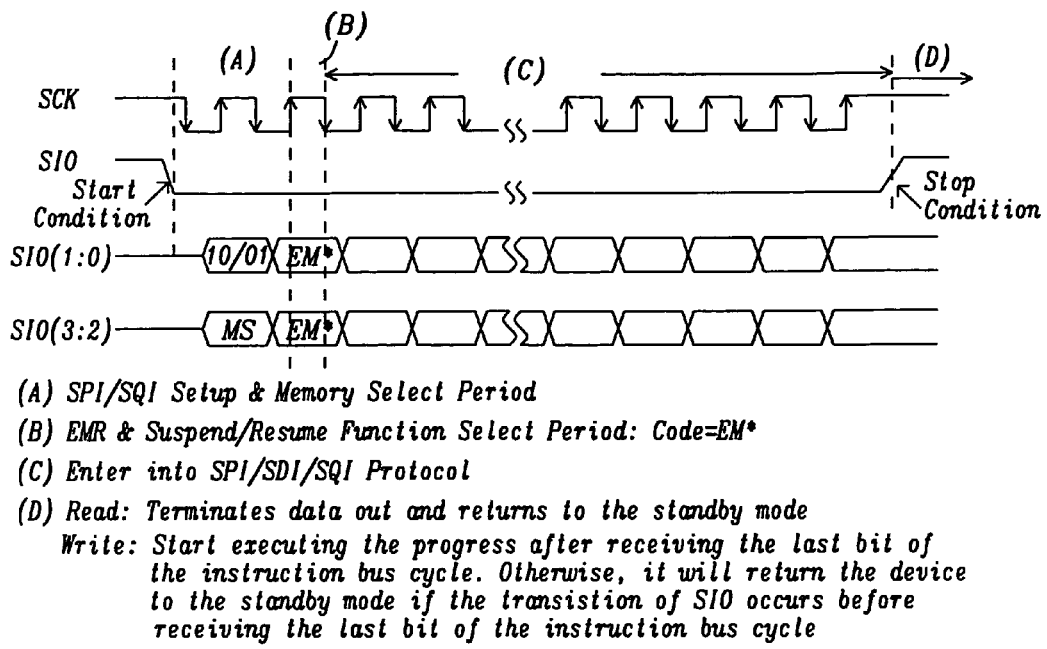

(A) SPI/SQI Setup & Memory Select Period
(B) EMR & Suspend/Resume Function Select Period: Code=EM*
(C) Enter into SPI/SDI/SQI Protocol
(D) Read: Terminates data out and returns to the standby mode
   Write: Start executing the progress after receiving the last bit of
   the instruction bus cycle. Otherwise, it will return the device
   to the standby mode if the transistion of SIO occurs before
   receiving the last bit of the instruction bus cycle

FIG. 5

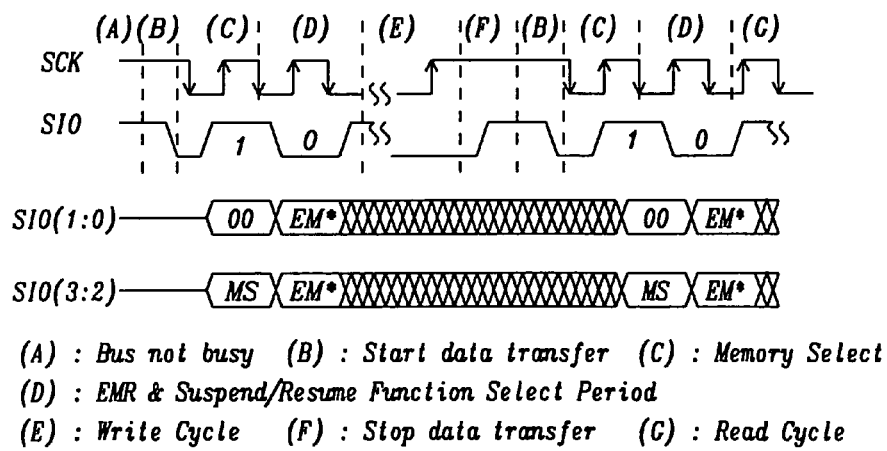

(A) : Bus not busy    (B) : Start data transfer    (C) : Memory Select
(D) : EMR & Suspend/Resume Function Select Period
(E) : Write Cycle    (F) : Stop data transfer    (G) : Read Cycle

FIG. 6

(A) SPI/SDI/SQI Setup, Memory Select, EMR & Suspend/Resume Function Select Period
(B) Enter into SPI/SDI/SQI Protocol with Write instruction in NOR/NAND Flash or EEPROM
(C) Write: Start executing the progress after receiving the last bit of the instruction bus cycle
(D) Enter into SPI/SQI Protocol with Read instruction in NOR/NAND Flash, EEPROM or SRAM

DIFFERENT TYPES OF MEMORY INTEGRATED IN ONE CHIP BY USING A NOVEL PROTOCOL

This application claims priority to Provisional Patent Application Ser. No. 61/403,556, filed on Sep. 17, 2010, which is herein incorporated by reference in its entirety.

BACKGROUND OF INVENTION

1. Field of Invention

The present invention is related to semiconductor memory and more specifically to chips integrated with different types of memory that preferably use programmable interfaces.

2. Description of Related Art

In the past 20 years, the cell structure, program and erase schemes and manufacturing process for NAND and NOR logic circuits have been incompatible preventing both products from being integrated into one chip. Normally, NAND logic cost is much cheaper than NOR logic, which is because the conventional NAND cell size is the smaller with $4\lambda^2$ to store two SLC (single level cell) binary data, where $\lambda$ is the minimum feature size of the lithography used. The highest NAND density is 64 Gb per chip with a MLC (multi-level cell) storage by using a 30 nm technology node. The conventional ETOX-based NOR cell has a cell size that is approximately $12\text{-}16\lambda^2$ and is getting more and more difficulty to scale down below 45 nm. Until recently, the highest density for a NOR flash sample is 1 Gb made from a 45 nm process, which is not in the mode of economic production.

Now, a novel SRAM, EEPROM, NAND and NAND-based NOR hybrid memory solution with multiple interfaces, multiple IO's and a fixed number of pins for all densities are possible, which will be disclosed herein in accordance with the spirit of the present invention. Besides the great advantage to achieve the high memory density, the present invention also provides a unique sequence to enter into different interface protocol.

SUMMARY OF THE INVENTION

It is an objective of the present invention to provide a memory system comprising memory chips, which contain a plurality of storage cell types and a plurality of major serial parallel interface protocols such as I²C, SPI, SDI and SQI in one memory chip.

Further it is an objective of the present invention to provide the following capabilities:

1. An eight pin package, wherein the eight pins comprise one power supply VDD, one ground line VSS, one serial clock SCK, one serial data input/output and four other programmable data input/output pins which are featured for different function according to the different interfaces.

2. A combination of a plurality of storage cell types into one chip by using a unified manufacturing process and comprising NOR Flash, NAND Flash, EEPROM and SRAM cells.

3. A two clock cycle timing waveform to establish memory selection, interface selection, the number of the expandable memory and a suspend function.

4. A protocol accesses the different memory by setting a serial I/O (SIO[3:2]) on the first serial clock cycle.

5. A timing waveform forming a protocol that can access the different interfaces by setting serial I/O (SIO[1:0]) at a first serial clock cycle.

6. A timing waveform as the protocol that can expand the memory size by setting serial I/O (SIO[2:0]) at a second serial clock cycle.

7. A timing waveform by setting serial I/O (SIO[3]) at the second serial clock cycle that can suspend or resume the usage of the corresponding interface.

8. A start condition on the falling edge of an SIO signal is provided when a serial clock (SCK) remains at a high level, which represents the pulling low function of the chip select. This operation is similar to a traditional I²C protocol, but it is further featured as the setup period to enter into SPI/SDI/SQI protocol.

9. A stop condition at the rising edge of an SIO signal is provided while SCK is at a high level, which represents the pulling high function of the chip select. This operation is similar to the traditional I²C protocol but it is further featured to enter into standby mode during the read operation or enter into the write operation.

10. A Write-While-Write for multiple write functions is provided to different nonvolatile memories simultaneously once the corresponding write command is issued. This operation accelerates the program performance.

11. A Read-While-Write function provides flexibility to read the memory while one or more nonvolatile memories (except the SRAM) are processing the write operation.

12. A Read-While-Transfer operation is available once the read operation is applied to SRAM, EEPROM and NOR flash and the data of a NAND cell is transferred to a page buffer (data register) during the page read operation. This operation accelerates the read performance.

13. A Write-While-Transfer operation once the write operation is applied to a SRAM, EEPROM and NOR flash and the data of the NAND cell is transferred to a page buffer (data register) during the page read operation. This operation accelerates the write performance.

14. A unified Status Register is provided to present all the conditions of different memory.

The present invention relates generally to a novel unified nonvolatile memory design that preferably uses an economic process, i.e. NAND-like process to make NOR flash, NAND flash, EEPROM and SRAM, wherein the NOR flash stores code, the NAND and EEPROM store large and small amount of data, respectively, and the SRAM can be used as the cache storage for high speed performance such as in XIP (execute in place) operation. The unified nonvolatile memory design offers the flexibility in memory storage for different applications and overcoming the disadvantage of parallel interfaces that increase external pins of the die and result in increased die cost. In addition the pin number would not be a constant and additional address pins would be required when density is being doubled, which would make circuit design difficult and not forward and backward compatible with different memory density.

The novel SRAM, EEPROM, NAND and NAND-based NOR hybrid memory design with multiple interfaces and multiple input and output pins within fixed pin numbers for all densities provides a great advantage for achieving the highest memory density, and provides a unique sequence to enter into different interface protocols.

BRIEF DESCRIPTION OF THE DRAWINGS

This invention will be described with reference to the accompanying drawings, wherein:

FIG. 5 is a setup timing waveform of entering into traditional SR/SDI/SQI protocol of the present invention;

FIG. 6 is a timing waveform for read while write operation in I²C protocol of the present invention;

DETAILED DESCRIPTION OF THE PREFERRED EMBODIMENT

Hereinafter, the present invention will be described in detail. However, the present invention is not limited to the timing waveforms disclosed below, but can be implemented to expand more command clock cycles. The following is described in order to enable those of ordinary skill in the art to embody and practice the present invention.

Figure 1:
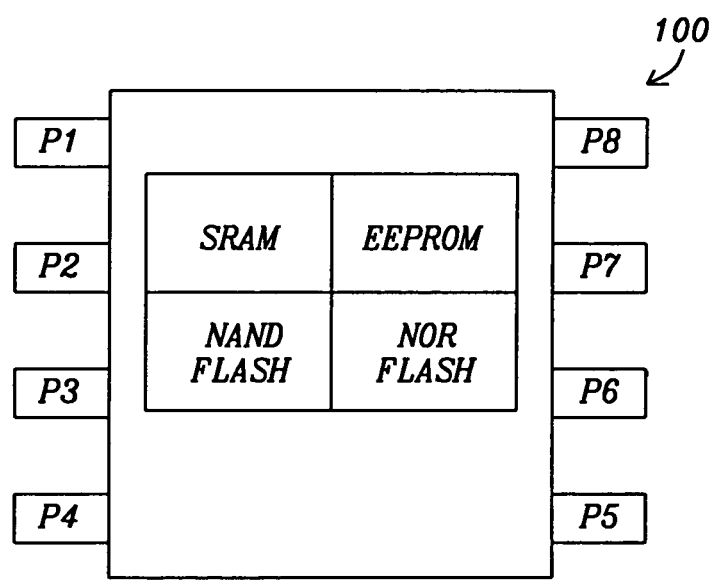
FIG. 1 is an eight-pin configured chip of the present invention.

FIG. 1 is an eight-pin packaged chip 100. The package includes four types of memory, i.e. EEPROM, NOR Flash, NAND Flash and SRAM integrated into one chip and is featured for low-power, high-performance operation in a low pin-count package. System designs using eight-pin memory devices occupy less board space and ultimately lower system costs. The high performance and small footprint of the device make it an ideal choice for mobile handsets, Bluetooth® headsets, optical disk drives, GPS applications and other portable electronic products.

TABLE 1

| Pin # | Interface | | | |
|---|---|---|---|---|
| | I²C | SPI | SDI | SQI |
| | | | Pin Name | |
| P1 | SIO | SIO | SIO | SIO |
| P2 | NC | SO | SO[0] | SIO[1] |
| P3 | NC | NC | SO[1] | SIO[2] |
| P4 | VSS | VSS | VSS | VSS |
| P5 | NC | SI | SI[0] | SIO[0] |
| P6 | SCK | SCK | SCK | SCK |
| P7 | NC | NC | SI[1] | SIO[3] |
| P8 | VDD | VDD | VDD | VDD |

Shown in TABLE 1 are the pin assignments for the eight-pin packaged memory chip 100 with respect to the different interfaces. No matter what interface is accessed and fixed function is applied to pins P1, P4, P6 and P8. Pin P4 represents the ground line and pin P8 represents the power supply VDD. Pin P1 is defined as SIO (serial input/output), which provides a bidirectional function to transfer command, address and data into and data out of the device, and pin P6 connects a serial clock (SCK) into the memory chip. The bidirectional SIO is formed with an open drain terminal; therefore, the SIO bus requires a pull-up resistor to VCC. For normal data transfer SIO is allowed to change only during SCK low. Changes during SCK high are reserved for indicating the Start and Stop conditions.

Pin P6 is defined as a serial clock input which is used to synchronize the data transfer from and to the device. Commands, addresses, or input data are latched on the rising edge of the clock input, while output data is shifted out on the falling edge of the clock.

Pins P2, P3, P5, and P7 are defined as NC (No Connection); however, pins P3 and P7 can be further reserved as coil connection pins for RFID (Radio Frequency Identification) application. Once RFID application is utilized, SDI and SQI interface can not be accessed because of the hard-wired pins dedicated for the coil connection. In other words, Pins P3 and P7 can be used as coil connection pins only in I²C and SPI modes.

In SPI mode, pin P2 is programmed (software) as Serial Data Output (SO) to transfer data serially out of the device. Data is shifted out on the falling edge of the serial clock (SCK). Pin P5 is programmed (software) as Serial Data Input (SI) to transfer to transfer commands, addresses or data serially into the device. Inputs are latched on the rising edge of the serial clock In SDI mode, pins P2 and P3 are programmed (software) as Serial Data Outputs SO[0] and SO[1] to transfer data serially out of the device. Data are shifted out on the falling edge of the serial clock SCK. Pins P5 and P7 are programmed (software) as Serial Data Inputs SI[0] and SI[1] to transfer commands, addresses or data serially into the device. Inputs are latched on the rising edge of the serial clock.

In SQI mode, pins P2, P3, P5 and P7 are programmed (software) as SIO[1], SIO[2], SIO[0] and SO[3], which provides a bidirectional function to transfer command, address and data into and data out of the device. Inputs are latched on the rising edge of the serial clock. Data is shifted out on the falling edge of the serial clock. All the above pins assignment are configured as the exemplary timing waveforms in the following description in detail.

Figure 2:
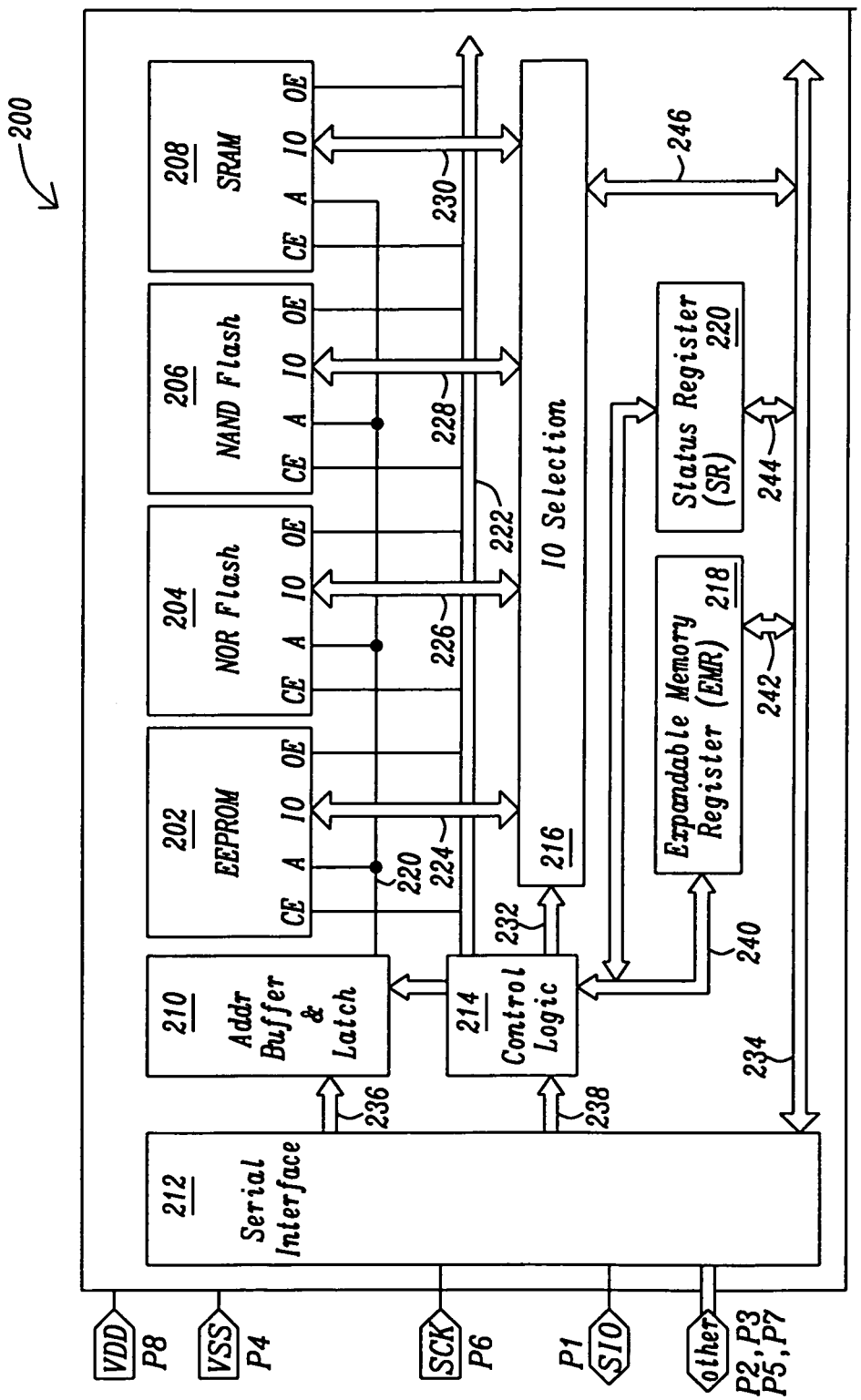
FIG. 2 is a functional block diagram of a hybrid memory system of the present invention.

FIG. 2 is a functional block diagram 200 of a hybrid memory system in the present invention. The hybrid memory system serves as the slave memory system device communicating with the host electronic device (not shown) through a serial communication interface. The host electronic device may be a microprocessor, a microcontroller, digital signal processor, or other digital computation device. The host is connected to an internal data bus that provides the necessary signals for the communication of control signals, address signals, and data signals for the slave device through the Input/Output pins assigned in TABLE 1 by different interfaces.

Four types of memory are integrated into this chip. The EEROM portion 202 can be used to store small data amounts with the byte-alterable capability. The NOR Flash 204 can be used to store the code to boost the performance while assuming the SQI interface (the maximum 4-bit multiplexed I/O serial interface), which can enhance the execute-in-place (XIP) capability for code shadowing on a built-in SRAM 208. There is a need for increasing amounts of memory to download content and execute multimedia applications with higher bandwidth in a mobile device. Also, users want the applications or media files being executed in their mobile device at vary fast speed. To satisfy the memory hungry demands of devices and an abundant multimedia environment, more high density memory is in demand; therefore, the NAND Flash is a part of this invention.

Within the functional block 200, the serial interface block 212 receives the necessary signals for the communication of control signals, address signals, and data signals and transmits the data signals to the host electronic device. Once the address signals are inputted to address buffer and latch 210 through the bus 236, the address signals 220 are transported to the address input of 4 types of memory. Meanwhile, the command codes 238 are inputted to the control logic 214, which can further be encoded to control the chip enable (CE) and output enable (OE) signals 222 to different memory and IO selection 216. In other words, IO for each memory section 224, 226, 228 and 230 can be further controlled by the signal lines 232. The bus signals 246 have the priority to occupy bus 234 once Status Register 220 and Expandable Memory Register 218 are deactivated by signal lines 240. Once issuing the command codes to read or write the Status Register 220, the bus signals 244 have the priority to occupy 234. In a same manner, once issuing the command codes to read or write the Expandable Memory Register 218, bus signals 242 has the priority to occupy bus 234. The Status register 220 has volatile and non-volatile bits that indicate the status of the availability of the different memory for any Read or Write operation, whether the device is Write enabled, and whether an erase or program operation is suspended. During an internal Erase or Program operation, the Status register 220 may be read to determine the completion of an operation in progress. It also provides more security functions such as protection features on different memory bock size, etc. As for the Expandable Memory Register 218, it has the programmable non-volatile bits to store the memory expansion information codes of the chip, which needs to match the external memory select codes to be activated before entering into the different interface protocols.

TABLE 2

| SIO[3:2] | Memory Select | SIO[1:0] | Interface Select |
|---|---|---|---|
| 00 | EEPROM | 00 | I²C |
|  |  | 01 | SPI |
|  |  | 10 | SDI |
|  |  | 11 | SQI |
| 01 | NOR Flash | 00 | I²C |
|  |  | 01 | SPI |
|  |  | 10 | SDI |
|  |  | 11 | SQI |
| 10 | NAND Flash | 00 | I²C |
|  |  | 01 | SPI |
|  |  | 10 | SDI |
|  |  | 11 | SQI |
| 11 | SRAM | 00 | I²C |
|  |  | 01 | SPI |
|  |  | 10 | SDI |
|  |  | 11 | SQI |

TABLE 2 shows a tabulation of memory select and interface selection for SPI, SDI and SQI fc Serial I/O, SIO[3:2], is used to decode the memory selection for EEPROM (00), NOR Flash (01), NA SIO[1:0] is used to decode the interface selection for I²C (00), SPI (01), SDI (10) and SQI (11).

TABLE 3

| SIO[2:0] | Expandable Memory Register | # of Memory |
|---|---|---|
| 000 | 000 | 1 |
| 000~001 | 000~001 | 2 |
| 000~011 | 000~011 | 3~4 |
| 000~111 | 000~111 | 5~8 |

Table 3 shows a tabulation of expandable memory register assignment to SIO[2:0] at the second clock of the present invention. If the stored expansion memory information codes match to the externally issued codes, the chip starts activating. Otherwise, it stays at the standby mode. Owing to different number of memory usage, the stored code mapping is predetermined as in the table.

TABLE 4

| SIO[3] | Function Decription |
|---|---|
| 1 | Suspend |
| 0 | Resume |

TABLE 4 shows a tabulation of the suspend function assigned to SIO[3] at the second clock of the present invention. In the traditional SPI memory, one pause function is available by using a pin called Hold#, which served as a hardware implimentation. While the device is paused, transitions on the inputs to the device will be ignored, with the exception of Chip Select, which allows the host to service higher priority interrupts. In the present invention, the pause function is activated by software. When SIO[3] is issued with a logical "1" at the second clock cycle, the device suspends the current task and allows the host to service higher priority interrupts. It may be resumed back previous to the interrupt by issuing a logical "0" at the second clock cycle of another start period.

Figure 3:
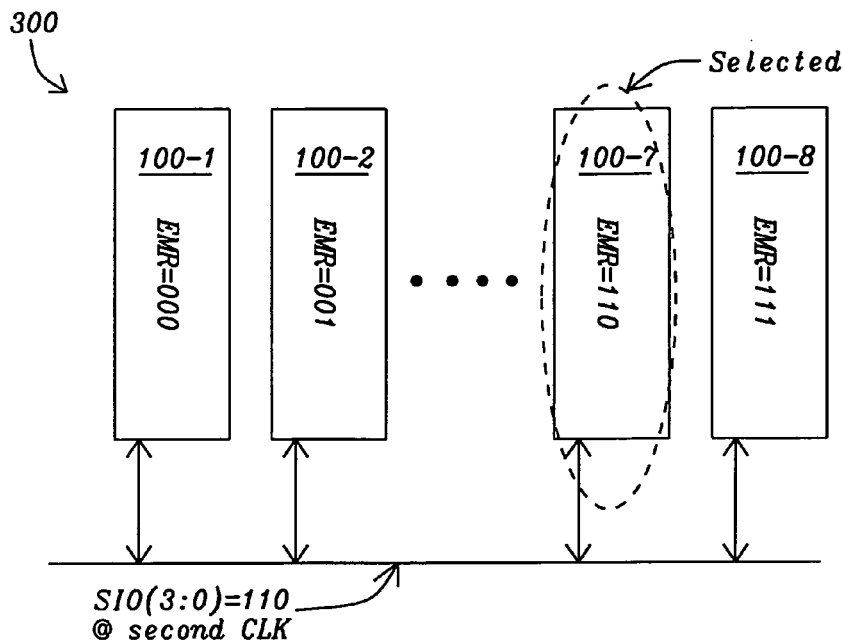
FIG. 3 is one exemplary case of selected EMR (Expandable Memory Register) of the present invention.

FIG. 3 is one exemplary case of a selected EMR (Expandable Memory Register) in the present invention. The maximum number of the expandable memory is eight; therefore eight chips 100-1, 100-2, . . . , 100-7 and 100-8 are configured together to receive the common SIO[3:0]. Chip 100-7 is selected in FIG. 3 to be activated because the internal EMR codes match the codes of SIO[2:0] during the second clock cycle at the start period.

Figure 4:
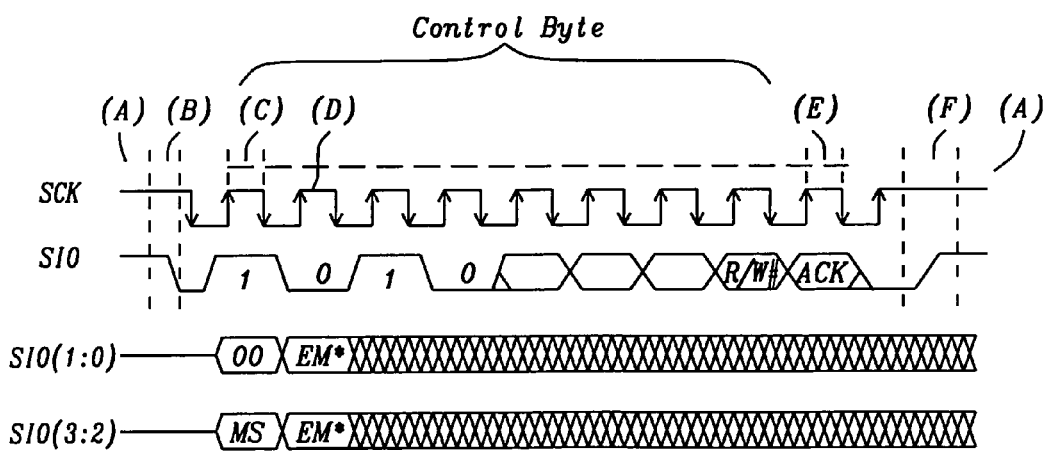
FIG. 4 is a traditional I²C protocol with add-on timing waveforms of the present invention.

FIG. 4 is a timing waveform for I²C protocol with the add-on timing control for SIO[3:0]. As the control codes shown in the TABLE 2, TABLE 3 and TABLE 4, SIO[3:2] is defined as the memory selection codes and SIO[1:0] is defined as interface selection codes at the first clock cycle. SIO[2:0] is defined as the expandable memory selection codes and SIO[3] is defined as the suspend control code at the second clock cycle.

During data transfer, SIO must remain stable whenever the SCK is high. Changes in the SIO while the SCK is high will be interpreted as a Start or Stop condition. Accordingly, the following bus conditions have an "A" portion in the beginning period, which represents non-busy status on the bus. Therefore, both SIO and SCK lines remain high. In the "B" portion, is represented the start condition to transfer data. A high-to-low transition of the SIO line while the clock (SCK) is high determines a Start condition. All commands must be preceded by a Start condition. In the "C" portion is represented the period for memory selection and I²C code has been set. In the "D" portion is represented the period for expandable memory selection and the suspend/resume code has been set. As for the traditional control byte, there is a partial timing overlapped with above said 8-bit codes at portions "C" and "D". In the "E" portion is represented the period of valid data. The state of SIO represents a valid data when, after a Start condition, SIO is stable for the duration of the high period of SCK signal. SIO on the line must be changed during the low period of SCK signal. There is one bit of data per clock pulse. Each data transfer is initiated with a Start condition and terminated with a Stop condition. The number of the data bytes transferred between the Start and Stop conditions is determined by the host device. This is one example of acknowledge bit shown as the valid data. In the "F" portion is represented the stop condition without transferring data. A low-to-high transition of the SIO line while the clock (SCK) is high determines a Stop condition and all operations must end with a Stop condition.

FIG. 5 is a timing waveform for entering into SPI/SDI/SQI protocols with extra timing control to SIO[3:0] and SCK. In the "A" and "B" portions, the control codes shown in the tables 2, 3 and 4, SIO[3:2] is defined as the memory selection codes and SIO[1:0] is defined as the interface selection codes at the first clock cycle. SIO[2:0] is defined as the expandable memory selection codes and SIO[3] is defined as the suspend control code at the second clock cycle. Since the start condition is also introduced here to transfer data like I²C protocol, a high-to-low transition of the SIO line while the clock (SCK) is high determines a Start condition. All commands in the following SPI/SDI/SQI protocol must be preceded by this Start condition as well. Although it has the similar start condition as the one in I²C protocol, the difference is that the extra two clock cycles is added before entering into the SPI/SDI/SQI protocol.

In the "C" portion is represented the period for one SPI/SDI/SQI interface, which has taken place for activation. For a high speed application requirement, SQI will be set because it quadruples the traditional bus transfer speed (SPI) at the same clock frequency. In the "D" portion is represented the stop condition without transferring data. A low-to-high transition of the SIO line while the clock (SCK) is high determines a Stop condition. All operations must end with a Stop condition. For the read operation data output is terminated and the operation returns to the standby mode to wait for the next command from the host device. For the write operation, the write operation starts preceding until the internal write timer stops the write operation.

FIG. 6 is a timing waveform of read while write operation for I²C protocol of the present invention. This operation precedes a read operation after issuing a write command; however, the read operation can be applied to any memory in the chip as long as the accessed portion does not perform the write operation. In other words, the corresponding high voltage in the write operation will not affect any the sensing scheme along the read path.

Accordingly, the following bus conditions have an "A" portion at the beginning of the period, which represents non-busy status on the bus. Therefore, both SIO and SCK lines remain high. In the "B" portion is represented the start condition for transfer data. A high-to-low transition of the SIO line while the clock (SCK) is high determines a Start condition. All commands must be preceded by a Start condition. In the "C" portion is represented the period for memory selection in which I²C code has been set. In The "D" portion is represented the period for expandable memory selection with the suspend/resume code set. As for the traditional control byte, there is a partial timing overlapped with above said 8-bit codes at portions "C" and "D". In the "E" portion is represented that the write command has been set. In the "F" portion is represented the stop condition without transferring data. A low-to-high transition of the SIO line while the clock (SCK) is high determines a Stop condition. Then the write operation proceeds to activate. In other words, all the program/erase operations will automatically start step by step, which is controlled by the internal state-machine. In the "G" potion, the read operation that follows is activated by a start condition with a read command code. Note that the read operation cannot be applied to the memory portion which is undergoing a write operation except the SRAM. Owing to the fast-speed alterability in SRAM, the write operation can be completed within one clock cycle. Therefore, there is no limitation on the access SRAM after writing data into the SRAM.

Figure 7:
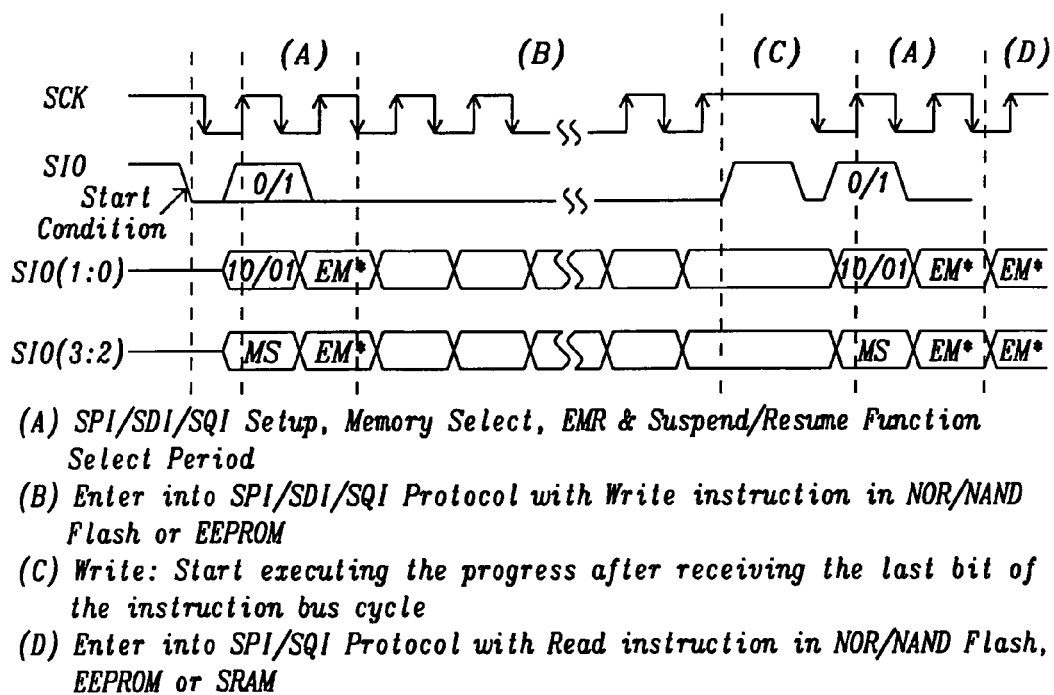
FIG. 7 is a timing waveform for read while write operation in SPI/SDI/SQI protocol of the present invention.

FIG. 7 is a timing waveform of read while write operation for SPI/SDI/SQI protocol in the present invention. The read operation precedes after issuing a write command; however, the read operation can be applied to any memory in the chip as long as the accessed portion does not perform the write operation. In other words, the corresponding high voltage in the write operation will not affect any the sensing scheme along the read path.

In the "A" and "B" portions of FIG. 7, the control codes shown in the tables 2, 3 and 4, SIO[3:2], are defined as the memory selection codes and SIO[1:0] are defined as the interface selection codes at the first clock cycle. SIO[2:0] codes are defined as the expandable memory selection codes and SIO[3] is defined as the suspend control code at the second clock cycle. Since the start condition is also introduced here to transfer data like I²C protocol, a high-to-low transition of the SIO line, while the clock (SCK) is high, determines a Start condition. All commands in the following SPI/SDI/SQI protocol must be preceded by the Start condition. Although it has the similar start condition as the one in I²C protocol, the difference is that the extra two clock cycles is added before entering into the SPI/SDI/SQI protocol. In the "C" portion is represented that the write command has been set and the write operation has proceeded to activate while a low-to-high transition of the SIO line at the high state of clock (SCK) takes place. In other words, all the program/erase operations will automatically start step by step, which is controlled by the internal state-machine. In the "D" potion, the following read operation is activated by a start condition with a read command code. Note that the read operation cannot be applied to the memory portion which is undergoing a write operation except the SRAM. Owing to the fast-speed alterability in SRAM, the write operation can be completed within one clock cycle. Therefore, there is no limitation to access SRAM after wring the data into the SRAM.

Figure 8:
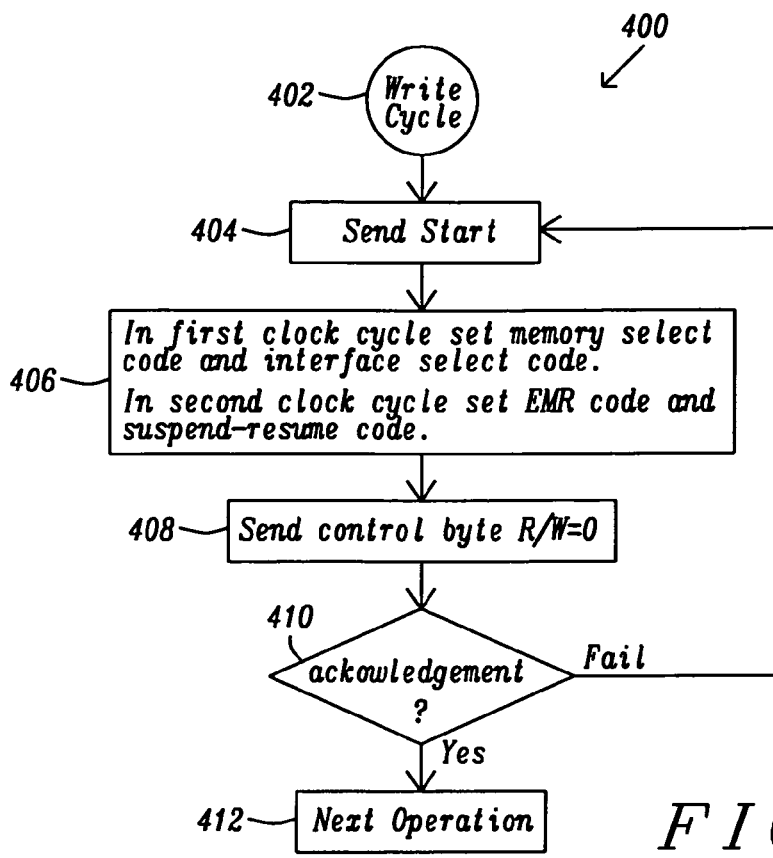
FIG. 8 is a method for indicating the acknowledge polling for I²C protocol in the present invention.

FIG. 8 is a flow chart 400, which indicates the acknowledge polling for I²C protocol in the present invention. After issuing the command code to perform the write operation, the host device will issue a acknowledge polling sequence to determine whether the write operation of the selected memory is completed or not? In step 402, the write cycle is initiated by an internal state-machine with a predetermined timer. In order to expedite and maximize the bus throughput in the system, the ACK polling can be initiated immediately. This involves the host processor sending a Start condition in step 404, followed by step 406 with the different memory, interface, expandable memory register and suspend/resume function select. Furthermore, the following control byte for a Write command (R/W=0) is set in step 408. The determination of ACK polling is judged at the step 410. If the selected memory is still busy with the write cycle, then no ACK will be returned. If no ACK is returned, then the Start bit and control byte must be resent. If the cycle is complete, then the selected memory will return the ACK and the host can then proceeds with the next Read or Write command in step 412.

Figure 9:
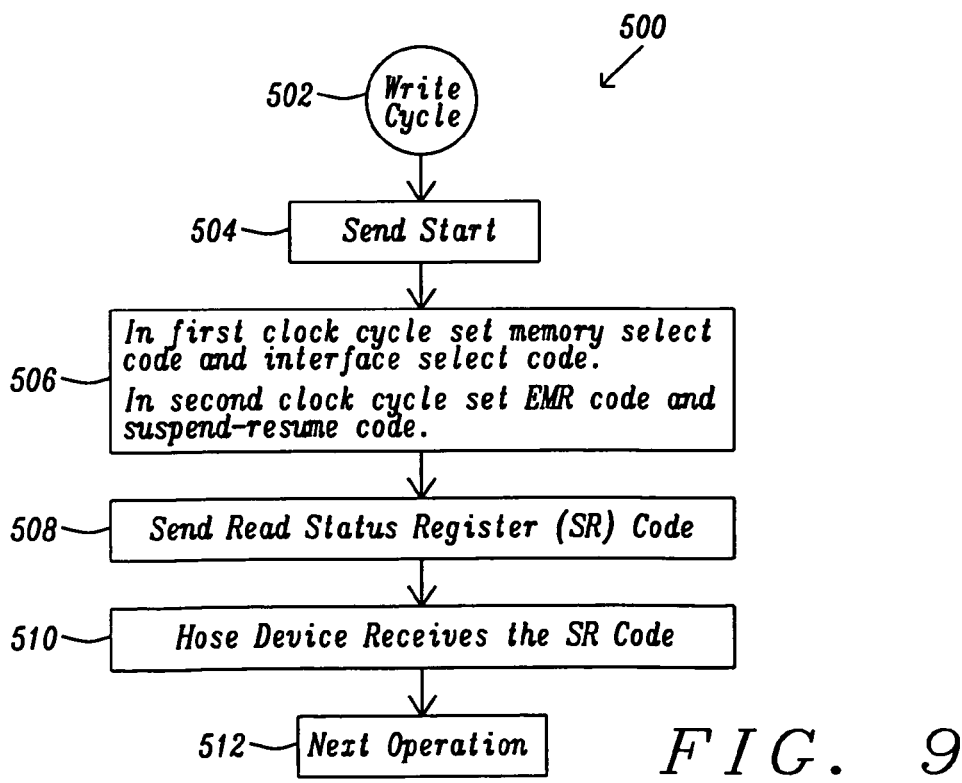
FIG. 9 is a method for reading the status register for SPI/SDI/SQI protocol in the present invention.

FIG. 9 is a flow chart 500 for read status register for SPI/SDI/SQI protocol in the present invention. After issuing the command code to perform a write operation, the host device will issue a read operation to access the status registers to determine whether the write operation of the selected memory is completed or not? In step 502, the write cycle is initiated by an internal state-machine with a predetermined timer. In order to expedite and maximize bus throughput in the system, the read status register command code can be initiated immediately after two initial clock cycles in steps 504 and 506. This involves the host sending a Start condition in step 504, followed by the step 506 with the different memory, interface, expandable memory register and suspend/resume function select. After the two initial clock cycles, the read status register command code can be set in step 508. The selected memory will indicate whether it is still busy or complete with the write cycle in the status register in the following read operation in step 510. The host can then proceeds with the next Read or Write command in step 512 according to the status shown in the status register.

TABLE 5

| | | Write Operation is under Processing | | | |
|---|---|---|---|---|---|
| Operational Mode | | SRAM | EEPROM | NAND Flash | NOR Flash |
| Write-While-Write | Write SRAM | NA | YES | YES | YES |
| | Write EEPROM | NA | YES* | YES | YES |
| | Write NAND Flash | NA | YES | YES* | YES |
| | Write NOR Flash | NA | YES | YES | YES* |
| Read-While-Write | Read SRAM | NA | YES | YES | YES |
| | Read EEPROM | NA | YES* | YES | YES |
| | Read NAND Flash | NA | YES | YES* | YES |
| | Read NOR Flash | NA | YES | YES | YES* |

Table 5 is a tabulation of achievable Write-While-Write and Read-While-Write operations of the present invention. After issuing the command code to perform the write operation in a NVM memory such as EEPROM, NAND flash and NOR flash (SRAM is not included), the host device can still issue a new write command code to any another memory because the built-in write page buffer of the NVM memory stores the loaded data for writing. It does not occupy the common bus line 234 (referring back to FIG. 2) but reserve the right to new data coming from the serial interface 212. As for the write operation of SRAM, it has the fastest write speed capability compare to NVM memory. Therefore, Write-While-Write is not applicable to SRAM because it is not necessary as a result of zero latency. However, the Write-While-Write operation can also be applicable to the same memory (as indicated by "*" in TABLE 5) as long as it is partitioned into dual banks or more banks with separate internal IO paths and the write command code is not issued to access the current writing memory cells. On the contrary, it is not applicable to the memory without separate bank structure inside.

In a same manner, Read-While-Write operation is applicable as the one in the Write-While-Write operation. The difference is the host device issues a new read command code to the slave chip in the former one. Note that the write operation can be preceded by multiple-task form because each NVM memory has its own built-in write page buffer.

TABLE 6 is a tabulation of achievable Read-While-Transfer and Write-While-Transfer operations in the present invention. Owing to the memory cells in series as a string in NAND flash, the cell read current is far less than the one of SRAM, EEPROM and NOR flash. It ends up with a page read sensing scheme to compensate the slow speed read performance. Normally, it will takes 10 us~20 us to transfer valid data from memory cell to the read page buffer. Therefore, during the transfer period on NAND flash, the host device can issue the read or write command to other memory. Also, the read or write command can be issued to the same NAND flash (noted by "*" in TABLE 6) as long as it is partitioned into dual or more banks with separate internal IO paths and the new read or write command code is not issued to access the current transferring memory cells.

TABLE 6

| Operational Mode | | NAND Flash is under Page Reading Process |
|---|---|---|
| Read-While-Transfer | Read SRAM | Yes |
| | Read EEPROM | Yes |
| | Read NAND Flash | Yes* |
| | Read NOR Flash | Yes |
| Write-While-Transfer | Write SRAM | Yes |
| | Write EEPROM | Yes |
| | Write NAND Flash | Yes* |
| | Write NOR Flash | Yes |

While the invention has been particularly shown and described with reference to preferred embodiments thereof, it will be understood by those skilled in the art that various changes in form and details may be made without departing from the spirit and scope of the invention.

What is claimed is:

1. A memory chip, comprising:
   a) a device comprising a plurality of memories further comprising a plurality of storage cell types;
   b) a plurality of serial parallel protocols, wherein the serial parallel protocols comprise:
      i) $I^2C$ protocol;
      ii) SPI protocol;
      iii) SDI protocol; and
      iv) SQI protocol;
   c) a limited number of electrical pins requiring use of said serial parallel protocols;
   d) a hardware serial interface;
   e) each memory of said plurality of memories formed of a different memory type and integrated together into said memory chip by the use of a unified manufacturing process;
   f) said hardware serial interface provides a bidirectional function to conserve a usage of said electrical pins and to transfer commands, addresses and data into said device and out of said device, wherein the serial-parallel protocols control the read, write and transfer of data in and out of the device, including write-while-write and read-while-write operations in the plurality of memories, wherein a state of a serial clock (SCK) signal and an input signal of a serial input output (SIO) determines memory operations.

2. The memory chip of claim 1, wherein said plurality of memories further comprises one each of the following memory types;
   a) EEPROM;
   c) NAND Flash;
   d) NOR Flash; and
   d) SRAM.

3. The memory chip of claim 1, wherein said memory operations determined by said state of the SCK and the input signal of the SIO further comprises:
   a) two cycles of SCK required to perform one of the following functions, comprising:
      i) memory selection;
      ii) interface selection;
      iii) amount of expandable memory;
      iv) suspend operation;
   b) normal data transfer allowed during a low SCK; and
   c) start and stop conditions determined at a high SCK, wherein the start condition requires a falling edge of the input signal of the SIO, and the stop condition requires a raising edge of the input signal of the SIO.

4. A memory chip comprising:
a) a plurality of memories,
b) a plurality of serial parallel protocols;
c) a limited number of electrical pins;
d) a hardware serial interface;
e) each memory of said plurality of memories formed of a different memory type and integrated together into a same semiconductor device by the use of a unified manufacturing process;
f) wherein said limited number of electrical pins is eight and the pins are assigned usage comprising the following:
   i) one power and one ground;
   ii) one system clock;
   iii) one serial interface; and
   iv) four as spare and used as programmed pins in SPI, SDI and SQI serial parallel protocols;
g) said hardware serial interface provides a bidirectional function to conserve a usage of said electrical pins and to transfer commands, addresses and data into said device and data out of the device, wherein the serial-parallel protocols control the read, write and transfer of data in and out of the device, including write-while-write and read-while-write operations in the plurality of memories, wherein a state of a serial clock (SCK) signal and an input signal of a serial input output (S10) determines memory operations.

5. A method for forming a multi-structured memory cells into one integrated circuit chip, comprising:
a) integrating together into a single memory chip a plurality of types of dissimilar memory cells using a unified manufacturing process to form a plurality of dissimilar memories;
b) forming a serial interface; and
c) controlling operation of said dissimilar memories with a plurality of serial parallel protocols, wherein said protocols applied through a signal input to said serial interface (SIO), wherein said protocols operate in conjunction with a serial clock (SCK) to control read and write of said memory cells and transfer data in and out of said memory chip;
d) said plurality of serial parallel protocols further comprising:
   i) $I^2C$ protocol;
   ii) SPI protocol;
   iii) SDI protocol; and
   iv) SQI protocol.

6. The method of claim 5, wherein said plurality of dissimilar memories comprise:
a) EEPROM;
b) NAND Flash;
d) NOR Flash; and
e) SRAM.

7. The method of claim 5, wherein said serial interface provides a bidirectional function to transfer command, address and data into the memory chip and data out of the memory chip.

8. The method of claim 5, wherein said operations of the dissimilar memories determined by a state of the SCK and the protocol signal inputted to the SIO and further comprises:
a) two cycles of SCK required to perform one of the following functions:
   i) memory selection;
   ii) interface selection;
   iii) amount of expandable memory;
   iv) suspend operation;
b) normal data transfer allowed during a low SCK signal; and
c) start and stop conditions determined at a high SCK signal, wherein the start condition requires a falling edge of the input signal of the SIO, and the stop condition requires a raising edge of the input signal of the SIO.

* * * * *